(12) United States Patent
Shin

(10) Patent No.: US 8,227,845 B2
(45) Date of Patent: Jul. 24, 2012

(54) ORGANIC LIGHT EMITTING DISPLAY

(75) Inventor: Hyun-Eok Shin, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/379,818

(22) Filed: Mar. 2, 2009

(65) Prior Publication Data

US 2009/0224256 A1    Sep. 10, 2009

(30) Foreign Application Priority Data

Mar. 5, 2008    (KR) .................. 10-2008-0020569

(51) Int. Cl.
*H01L 31/113* (2006.01)
(52) U.S. Cl. .................. 257/292; 257/79; 257/E33.063
(58) Field of Classification Search .................. 257/40, 257/98, 288, 292, 294, E51.025, 79, E33.063
See application file for complete search history.

(56) References Cited

U.S. PATENT DOCUMENTS

| | | | |
|---|---|---|---|
| 2005/0242713 A1* | 11/2005 | Yamazaki | 313/503 |
| 2006/0118788 A1* | 6/2006 | Park | 257/72 |
| 2006/0181198 A1* | 8/2006 | Gotoh et al. | 313/503 |
| 2007/0111369 A1* | 5/2007 | Chun et al. | 438/99 |
| 2007/0278497 A1* | 12/2007 | Kawakami et al. | 257/79 |
| 2008/0057632 A1* | 3/2008 | Arai et al. | 438/149 |
| 2008/0251785 A1* | 10/2008 | Noh et al. | 257/40 |

FOREIGN PATENT DOCUMENTS

| | | | |
|---|---|---|---|
| JP | 54-128296 | * | 10/1979 |
| JP | 2006-179878 | | 7/2006 |
| KR | 1999-0059980 | | 7/1999 |
| KR | 1999-0075412 | | 10/1999 |
| KR | 2001-0108833 A1 | | 12/2001 |
| WO | WO 2008/066030 | * | 6/2008 |

OTHER PUBLICATIONS

Korean Office action issued by Korean Patent Office on Apr. 30, 2009 in Applicant's Priority Document: KR2008-0020569.
Request for Entry of the Accompanying Document for Korean Registration Determination Certificate attached herewith.
Registration Determination Certificate from Korean Patent Office issued in Applicant's corresponding Korean Patent Application No. 10-2008-0020569 dated Oct. 28, 2009.

* cited by examiner

*Primary Examiner* — Zandra Smith
*Assistant Examiner* — Jamie C Niesz
(74) *Attorney, Agent, or Firm* — Robert E. Bushnell, Esq.

(57) ABSTRACT

An organic light emitting display that prevents a material used to form a source electrode and a drain electrode from being diffused into an active layer and reduces contact resistance between the source and drain electrodes and a first electrode includes: a substrate; an active layer arranged on the substrate and including silicon; a gate electrode arranged on the substrate and insulated from the active layer; a source electrode and a drain electrode each of a single layer structure, insulated from the gate electrode, and electrically connected to the active layer; a first electrode electrically connected to either the source electrode or the drain electrode; an organic light emitting layer arranged on the first electrode; and a second electrode arranged on the organic light emitting layer, each source electrode and drain electrode includes an aluminum alloy containing nickel and silicon.

11 Claims, 4 Drawing Sheets

ORGANIC LIGHT EMITTING DISPLAY

CLAIM OF PRIORITY

This application makes reference to, incorporates the same herein, and claims all benefits accruing under 35 U.S.C. §119 from an application for ORGANIC LIGHT EMITTING DISPLAY APPARATUS earlier filed in the Korean Intellectual Property Office on the 5 Mar. 2008 and there duly assigned Serial No. 10-2008-0020569.

BACKGROUND OF THE INVENTION

1. Field of the Invention

The present invention relates to an organic light emitting display, and more particularly, the present invention relates to an organic light emitting display that easily prevents a material used to form source and drain electrodes from being diffused into an active layer and reduces contact resistance between the source and drain electrodes and a first electrode.

2. Description of the Related Art

In recent years, many displays have tended to be replaced by portable thin flat panel displays. An example of such a flat panel display is an electroluminescent display. Electroluminescent displays are self-emitting displays having a wide viewing angle, good contrast, and rapid response speed, and thus, have been spotlighted as next generation displays. In particular, organic light-emitting displays including a light-emitting layer formed of an organic material exhibit better brightness, driving voltage, and response speed characteristics than inorganic light-emitting displays, and can form multicolored images.

Active matrix organic light emitting displays include a Thin Film Transistor (TFT) connected to an organic light emitting device. A source electrode or a drain electrode of the TFT is electrically connected to a pixel electrode of the organic light emitting display. A voltage is also supplied to an opposite electrode facing the pixel electrode. As a result, an organic light emitting layer disposed between the pixel electrode and the opposite electrode emits visible light.

The source electrode or the drain electrode of the TFT contacts an active layer. Each of the source and drain electrodes includes a metal, such as aluminum (Al), for low resistance. The active layer includes silicon (Si). The metal, such as Al, used to form each of the source and drain electrodes may be diffused into the active layer. The diffusion becomes severe in a high temperature process, such as a thin film forming process, thereby short-circuiting the active layer or deteriorating channel characteristics.

The pixel electrode contacting the source and drain electrodes may include Indium Tin Oxide (ITO). Contact resistance between metals used to form the source and drain electrodes and ITO used to form the pixel electrode is higher than a resistance between the metals. In particular, when each of the source and drain electrodes is formed of a single metal, Al, an oxide is formed on a surface of each of the source and drain electrodes, thereby further increasing contact resistance between Al and ITO.

SUMMARY OF THE INVENTION

The present invention provides an organic light emitting display that easily prevents a material used to form source and drain electrodes from being diffused into an active layer, and reduces contact resistance between the source and drain electrodes and a first electrode.

According to an aspect of the present invention, an organic light emitting display is provided including: a substrate; an active layer arranged on the substrate and including silicon; a gate electrode arranged on the substrate and insulated from the active layer; a source electrode and a drain electrode each of a single layer structure, insulated from the gate electrode, and electrically connected to the active layer; a first electrode electrically connected to either the source electrode or the drain electrode; an organic light emitting layer arranged on the first electrode; and a second electrode arranged on the organic light emitting layer, each source electrode and drain electrode includes an aluminum alloy containing nickel and silicon.

Each source electrode and drain electrode includes nickel and silicon at a concentration of 1 to 3 wt %.

Each source electrode and drain electrode includes a material selected from the group consisting of boron (B), carbon (C), and lanthanide.

Each source electrode and drain electrode includes a material selected from the group consisting of boron (B), carbon (C), and lanthanide at a concentration of 0.01 to 2 wt %.

The first electrode includes Indium Tin Oxide (ITO).

The first electrode includes: a first layer contacting either the source electrode or the drain electrode and including ITO; a second layer arranged on the first layer and including Ag; and a third layer arranged on the second layer and including ITO.

According to another aspect of the present invention, an organic light emitting display is provided including: a substrate; an active layer arranged on the substrate and including silicon; a gate electrode arranged on the substrate and insulated from the active layer; a source electrode and a drain electrode each of a single layer structure, insulated from the gate electrode, and electrically connected to the active layer; a first electrode electrically connected to either the source electrode or the drain electrode; an organic light emitting layer arranged on the first electrode; and a second electrode arranged on the organic light emitting layer, each source electrode and drain electrode includes an aluminum alloy containing germanium and gadolinium.

Each source electrode and drain electrode has a germanium concentration of 1 to 3 wt %.

Each source electrode and drain electrode has a gadolinium concentration of 0.01 to 2 wt %.

The first electrode includes: a first layer contacting either the source electrode or the drain electrode and including ITO; a second layer arranged on the first layer and including Ag; and a third layer arranged on the second layer and including ITO.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention is described more fully below with reference to the accompanying drawings, in which exemplary embodiments of the present invention are shown.

Figure 1:
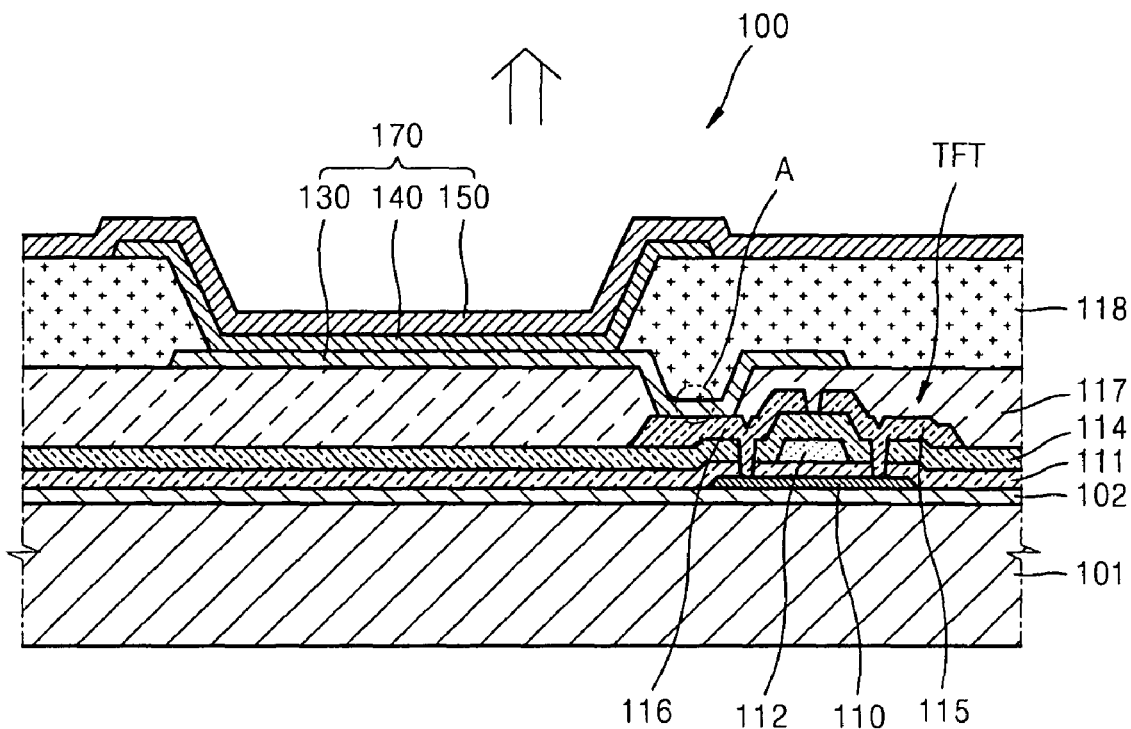
FIG. 1 is a cross-sectional view of an organic light emitting display according to an embodiment of the present invention.
Figure 2:
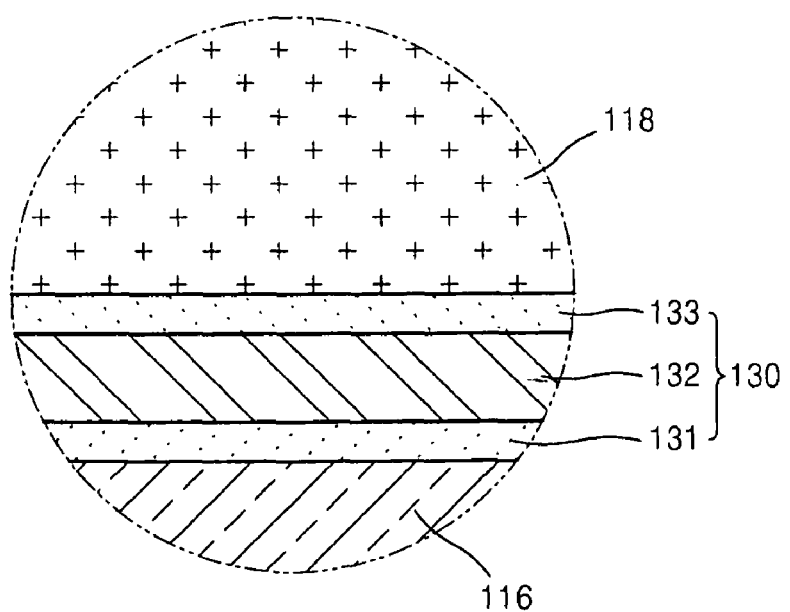
FIG. 2 is an enlarged cross-sectional view of portion A of FIG. 1.

FIG. 1 is a cross-sectional view of an organic light emitting display 100 according to an embodiment of the present invention. FIG. 2 is an enlarged cross-sectional view of portion A of FIG. 1.

Referring to FIG. 1, the organic light emitting display 100 includes a substrate 101, a Thin Film Transistor (TFT), and an organic light emitting device 170. The TFT includes an active layer 110, a gate electrode 112, a source electrode 115, and a drain electrode 116. The source electrode 115 and drain electrode 116 may be formed as a single layer structure including an aluminum alloy containing nickel and silicon. The organic light emitting device 170 includes a first electrode 130, a second electrode 150, and an organic light emitting layer 140.

Each constituent element is explained in detail as follows. The substrate 101 may be formed of a transparent glass material having $SiO_2$ as a main component. The substrate 101 is not limited thereto and may be formed of a transparent plastic material. If the substrate 101 is a plastic substrate, the plastic substrate may be formed of an insulating organic material selected from the group consisting of polyethersulphone (PES), polyacrylate (PAR), polyetherimide (PEI), polyethyelenen napthalate (PEN), polyethyelenetetrephthalate (PET), polyphenylene sulfide (PPS), polyallylate, polyimide, polycarbonate (PC), cellulose tri-acetate (TAC), and cellulose acetate propionate (CAP).

If the organic light emitting display 100 is a top emission type display in which images are formed at a side of the organic light emitting display 100 opposite to that at which the substrate 101 is disposed, the substrate 101 does not have to be formed of a transparent material. In this case, the substrate 101 may be formed of a metal. The substrate 101 may include one or more materials selected from the group consisting of carbon, iron, chrome, manganese, nickel, titanium, molybdenum, stainless steel (SUS), an Invar alloy, an Inconel alloy, and a Kovar alloy. However, the present invention is not limited thereto. The substrate 101 may be formed of a metal foil.

A buffer layer 102 may be formed on a top surface of the substrate 101 in order to make the substrate 101 smooth and prevent penetration of impurities. The buffer layer 102 may include at least one of $SiO_2$ and SiNx.

The TFT is formed on the top surface of the substrate 101. At least one TFT is formed at each pixel. The TFT is electrically connected to the organic light emitting device 170.

In more detail, the active layer 110 having a predetermined pattern is formed on the buffer layer 102. The active layer 110 may be formed of an organic semiconductor or an inorganic semiconductor, such as amorphous silicon or polysilicon, and includes a source region, a drain region, and a channel region.

The source and drain regions may be formed by doping impurities into the active layer 110 formed of amorphous silicon or polysilicon. If boron, which is a Group III element, is doped into the active layer 110, a p-type semiconductor may be formed, and if nitrogen (N), which is a Group V element, is doped into the active layer 110, an n-type semiconductor may be formed.

A gate insulating layer 111 is formed on the active layer 110, and the gate electrode 112 is formed on a predetermined region of the gate insulating layer 111. The gate insulating layer 111 for insulating the active layer 110 from the gate electrode 112 may be formed of an inorganic material, such as SiNx or $SiO_2$.

The gate electrode 112 may be formed of MoW or Al/Cu, but the present invention is not limited thereto and the gate electrode 112 may be formed of various materials in consideration of adhesion with an adjacent layer, the flatness of a stacked layer, electrical resistance, and processability. The gate electrode 112 is connected to a gate line (not shown) that supplies a TFT on/off signal.

An interlayer insulating layer 114 having contact holes formed therein is formed on the gate electrode 112.

The source electrode 115 and the drain electrode 116 respectively contact the source and drain regions of the active layer 110 through the contact holes.

Each source electrode 115 and drain electrode 116 may be formed of an aluminum alloy containing nickel and silicon. Also, each source electrode 115 and drain electrode 116 may include other elements. In this regard, each source electrode 115 and drain electrode 116 may also include a material selected from the group consisting of boron (B), carbon (C), and lanthanide.

In a conventional organic light emitting display, a barrier layer is necessary to prevent aluminum used to form the source and drain electrodes from being diffused into an active layer. Accordingly, each source and drain electrode is formed as a double-layer structure including a barrier layer.

However, according to the current embodiment of the present invention, each source electrode 115 and drain electrode 116 is formed of an aluminum alloy containing silicon. In general, if each source electrode 115 and drain electrode 116 is formed of pure aluminum, silicon of the active layer 110 is diffused into the source electrode 115 and the drain electrode 116 such that each source electrode 115 and drain electrode 116 has a silicon concentration of 1 wt % or less. As a result, aluminum of each source electrode 115 and drain electrode 116 is diffused into the active layer 110, thereby causing spiking.

However, according to the present embodiment, since each source electrode 115 and drain electrode 116 contains silicon at a concentration of more than 1 wt %, that is—greater than the concentration obtained when the silicon of the active layer 110 is dissolved into the source electrode 115 and the drain electrode 116, the silicon of the active layer 110 can be prevented from being dissolved into the source electrode 115 and the drain electrode 116. As a result, the aluminum of the source electrode 115 and the drain electrode 116 can be prevented from being diffused into the active layer 110.

If each source electrode 115 and drain electrode 116 contains too much silicon, the resistance is increased and the electrical characteristics are deteriorated. Accordingly, each source electrode 115 and drain electrode 116 should include silicon at a concentration of less than 3 wt %.

Each source electrode 115 and drain electrode 116 is formed of an aluminum alloy containing nickel to improve contact characteristics with the first electrode 130, explained later in more detail.

Each source electrode 115 and drain electrode 116 includes boron (B), carbon (C), and lanthanide to prevent galvanic corrosion, explained later in more detail.

A passivation layer 117 covers and protects the TFT formed as described above. The passivation layer 117 may include at least one of an inorganic insulating layer and an organic insulating layer. The inorganic insulating layer may include $SiO_2$, SiNx, SiON, $Al_2O_3$, $TiO_2$, $Ta_2O_5$, $HfO_2$, $ZrO_2$, BST, or PZT, and the organic insulating layer may include a general polymer, such as poly(methyl methacrylate) (PMMA) or polystyrene (PS), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof. The passivation layer 117 may be formed as a composite stack structure of an inorganic insulating layer and an organic insulating layer.

A via hole is formed in the passivation layer 117. The drain electrode 116, formed under the passivation layer 117, is exposed through the via hole.

The first electrode 130, which is an anode of the organic light emitting device 170, is formed on the passivation layer 117.

The first electrode 130 may be formed in a predetermined pattern by photolithography. The first electrode 130 is electrically connected to the drain electrode 116 of the TFT through the via hole.

A pixel defining layer 118 is formed of an insulating material covering the first electrode 130 and the passivation layer 117. After a predetermined opening is formed in the pixel defining layer 118, the organic light emitting layer 140 of the organic light emitting device 170 is formed in an area defined by the opening. The second electrode 150, which is a cathode of the organic light emitting device 170, is formed to cover all pixels.

Although the first electrode 130 serves as an anode and the second electrode 150 serves as a cathode in the present embodiment, the polarities of the first and second electrodes 130 and 150 may be opposite to this.

The organic light emitting device 170, which displays an image by emitting light according to the flow of current, includes the first electrode 130 electrically connected to the drain electrode 116 of the TFT through a contact hole, the organic light emitting layer 130, and the second electrode 150.

The second electrode 150 disposed over the first electrode 130 may act as a cathode by being connected to an external terminal (not shown). The second electrode 150 may be formed over an entire active area.

When the organic light emitting display 100 is a top emission type display that forms an image in a direction towards the second electrode 150, as shown in FIG. 1, the first electrode 130 may be a reflective electrode and the second electrode 150 may be a transparent electrode.

Referring to FIG. 2, the first electrode 130 includes a first layer 131, a second layer 132, and a third layer 133. The first layer 131, which is the lowermost layer of the first electrode 130, contacts the drain electrode 116 and the passivation layer 117. The first layer 131 may include ITO. The second layer 132 is formed on the first layer 131. The second layer 132 is formed of a material selected from the group consisting of Ag, Mg, Al, Pt, Pd, Au, Ni, Nd, Ir, Cr, Li, Ca, and a compound thereof, and may act as a reflective layer. The third layer 133 is formed on the second layer 132, and may be formed of ITO, IZO, ZnO, or $In_2O_3$ having a high work function.

The first electrode 130 contacts the passivation layer 117. An organic material or an inorganic material used to form the passivation layer 117 has poor adhesion to a metal, such as silver (Ag). However, the first electrode 130 of FIG. 1 includes the first layer 131. The first layer 131 includes ITO. Since ITO has good adhesion to the organic material or the inorganic material of the passivation layer 117, adhesion between the first electrode 130 and the passivation layer 117 can be improved.

When a metal, such as aluminum, used to form the source electrode 115 and the drain electrode 116 is exposed to air, an oxide is naturally formed. Once an oxide layer is formed, the oxide layer functions as an insulating layer, thereby deteriorating contact characteristics between the source and drain electrodes 115 and 116 and the first electrode 130.

The metal, such as aluminum, used to form the source electrode 115 and the drain electrode 116 has poor electrical contact characteristics with ITO used to form the first layer 131. Hence, due to an aluminum oxide layer formed on each of the source electrode 115 and the drain electrode 116, contact characteristics between the source and drain electrodes 115 and 116 and the first layer 131 are further deteriorated.

To solve the problem, in a conventional organic light emitting display, a protective layer is formed on a contact portion between source and drain electrodes and a first electrode in order to prevent an oxide layer from being formed.

However, according to the present embodiment, each source electrode 115 and drain electrode 116 includes an aluminum alloy containing nickel. The aluminum alloy containing nickel can prevent aluminum oxide ($Al_2O_3$) from being formed.

Since aluminum oxide can be prevented from being formed on surfaces of the source electrode 115 and the drain electrode 116, electrical contact characteristics between the source and drain electrodes 115 and 116 and the first electrode 130 are improved. That is, the contact resistance between the drain electrode 116 and the first electrode 130 is reduced.

Each of the source electrode 115 and the drain electrode 116 has a nickel concentration of 1 to 3 wt %. When the source electrode 115 and drain electrode 116 include a nickel concentration of less than 1 wt %, the desired effect of preventing the aluminum oxide from being formed on the surfaces of the source electrode 115 and the drain electrode 116 cannot be expected. Accordingly, each source electrode 115 and drain electrode 116 should have a nickel concentration of more than 1 wt %.

When the source electrode 115 and drain electrode 116 includes a nickel concentration of greater than 3 wt %, the resistance of the source electrode 115 and the drain electrode 116 tends to be increased. Accordingly, each source electrode 115 and drain electrode 116 should have a nickel concentration of less than 3 wt %.

In the conventional art, galvanic corrosion occurs between source and drain electrodes and a first electrode because a standard reduction potential difference between aluminum used to form the source electrode and the drain electrode and ITO used to form the first electrode is high. That is, the standard reduction potential of aluminum is approximately −1.67 whereas the standard reduction potential of ITO is approximately −0.82.

However, according to the present embodiment, each source electrode 115 and drain electrode 116 of FIG. 1 includes boron (B), carbon (C), and lanthanide. When boron (B), carbon (C), and lanthanide are added to aluminum, a standard reduction potential is reduced. Accordingly, a standard reduction potential difference between the source and drain electrodes 115 and 116 and the first electrode 130 is reduced, thereby preventing galvanic corrosion.

Even when the source electrode 115 and drain electrode 116 include a very small amount of boron (B), carbon (C), and lanthanide, a standard reduction potential is reduced. Accordingly, it is preferable that boron (B), carbon (C), and lanthanide be added at a concentration of more than 0.01 wt % because galvanic effect is small when the concentration is less than 0.01 wt %. However, when boron (B), carbon (C), and lanthanide in excess of a given limit are added, the desired effect of preventing galvanic corrosion cannot be expected, a process of manufacturing the source electrode 115 and the drain electrode 116 becomes complicated, and manufacturing costs are increased. Accordingly, it is preferable that boron (B), carbon (C), and lanthanide should be added at a concentration of less than 2 wt %.

If the second electrode 150 is a transparent electrode, the second electrode 150 may be formed by depositing a metal with a low work function, such as Ag, Mg, Al, Pt, Pd, Au, Ni, Nd, Ir, Cr, Li, Ca, or a compound thereof, and forming an auxiliary electrode layer or a bus electrode line including a transparent material, such as ITO, IZO, ZnO, or $In_2O_3$, on the deposited metal with the low work function.

The organic light emitting layer 140 disposed between the first electrode 130 and the second electrode 150 emits light when voltages are supplied to the first electrode 130 and the second electrode 150. The organic light emitting layer 140 may be formed of a low molecular organic material or a high molecular organic material. If the organic light emitting layer 140 is formed of a low molecular organic material, a Hole Transport Layer (HTL) and a Hole Injection Layer (HIL) may be stacked under the organic light emitting layer 140 in the direction of the first electrode 130, and an electron transport layer and an electron injection layer may be stacked on the organic light emitting layer 140 in the direction of the second electrode 150. If necessary, various other layers may be stacked. The organic materials may be copper phthalocyanine (CuPc), N,N'-Di(naphthalene-1-yl)-N,N'-diphenyl-benzidine (NPB), or tris-8-hydroxyquinoline aluminum (Alq3).

However, if the organic light emitting layer 140 is formed of a high molecular organic material, only a Hole Transport Layer (HTL) may be formed under the organic light emitting layer 140 in the direction of the first electrode 130. The HTL is formed on the first electrode 130 by inkjet printing or spin coating by using poly-(2,4)-ethylene-dihydroxy thiophene (PEDOT) or polyaniline (PANI). The organic light emitting layer 140 may be formed of poly(p-phenylene vinylene) (PPV), soluble PPVs, cyano-PPV, polyfluorene, or the like. A color pattern may be formed by inkjet printing, spin coating, or thermal transfer using laser.

A sealing member (not shown) may be disposed to face a surface of the second electrode 150 in order to protect the organic light emitting device 170 from external moisture or oxygen. The sealing member may be formed of a transparent material. To this end, the sealing member may be formed of glass, plastic, or a multi-layer structure of a plurality of organic materials and inorganic materials.

Figure 3:
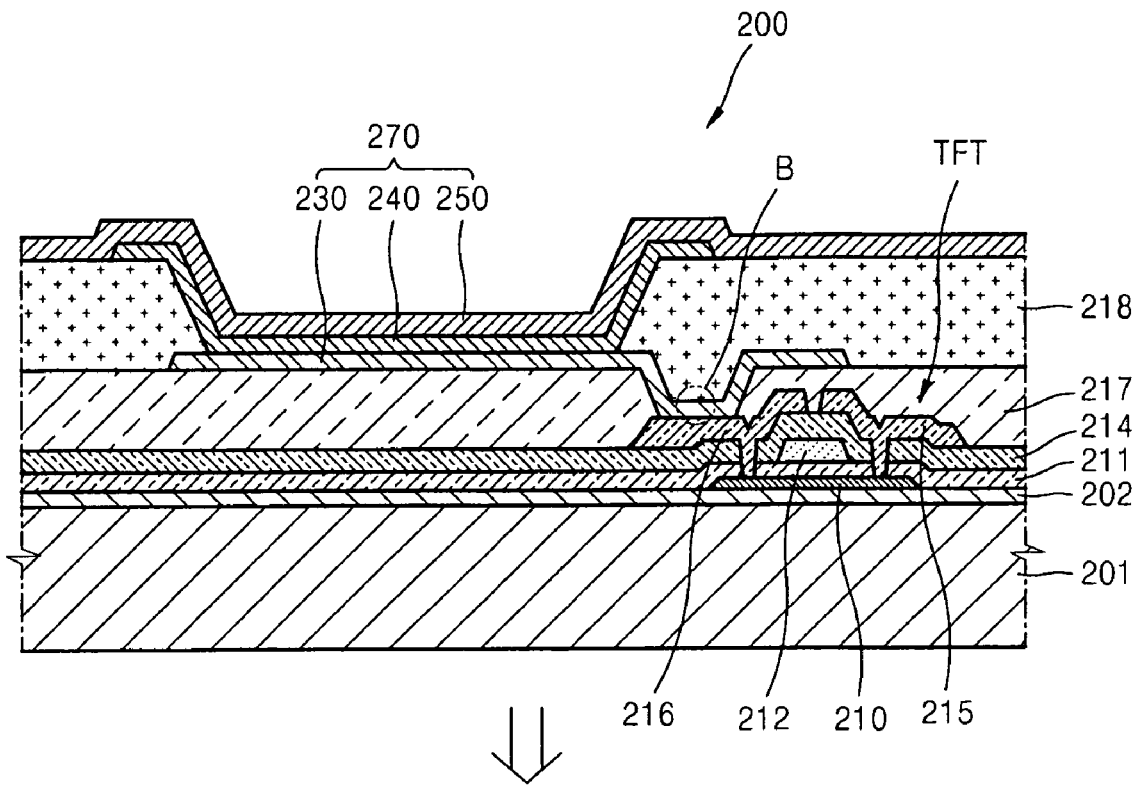
FIG. 3 is a cross-sectional view of an organic light emitting display according to another embodiment of the present invention.
Figure 4:
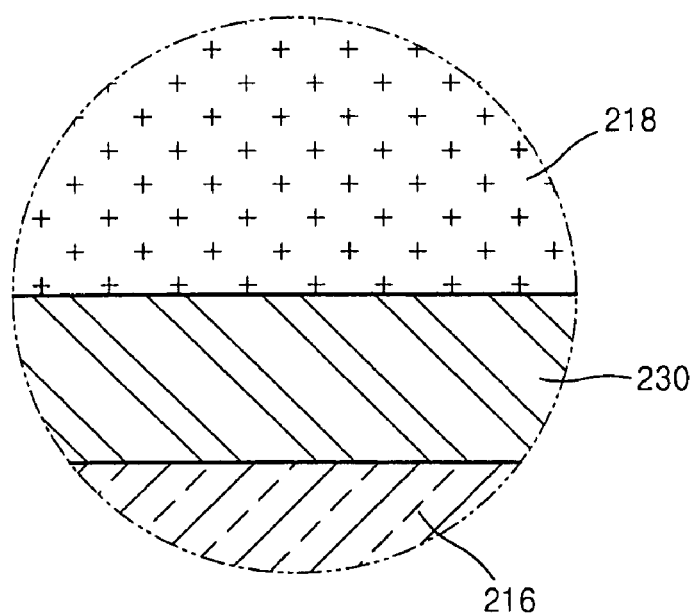
FIG. 4 is an enlarged cross-sectional view of portion B of FIG. 3.

FIG. 3 is a cross-sectional view of an organic light emitting display 200 according to another embodiment of the present invention. FIG. 4 is an enlarged cross-sectional view of portion B of FIG. 3. For convenience, the differences between the present embodiment and previous embodiment are described as follows. The organic light emitting display 200 of FIG. 3 is a bottom emission type display that forms image in the direction of a substrate 201 of the organic light emitting display 200.

Referring to FIG. 3, the organic light emitting display 200 according to the current embodiment of the present invention includes the substrate 201, a TFT, and an organic light emitting device 270. The TFT includes an active layer 210, a gate electrode 212, a source electrode 215, and a drain electrode 216. The source electrode 215 and drain electrode 216 may each be formed as a single layer structure including an aluminum alloy containing nickel and silicon. The organic light emitting device 270 includes a first electrode 230, a second electrode 250, and an organic light emitting layer 240.

Since the organic light emitting display 200 forms images at the side thereof at which the substrate 201 is disposed, the substrate 201 should be transparent. In this regard, the substrate 201 may be formed of a transparent glass material having $SiO_2$ as a main component. However, the substrate 201 is not limited thereto, and may be formed of a transparent plastic material. If the substrate 201 is a plastic substrate, the plastic substrate may be formed of an insulating organic material selected from the group consisting of PES, PAR, PEI, PEN, PET, PPS, polyallylate, polyimide, PC, TAC, and CAP.

A buffer layer 202 is formed on a top surface of the substrate 201, and the TFT is formed on a top surface of the buffer layer 202. At least one TFT is formed at each pixel, and is electrically connected to the organic light emitting device 270.

In more detail, the active layer 210 having a predetermined pattern is formed on the buffer layer 202. The active layer 210 may be formed of an organic semiconductor or an inorganic semiconductor, such as amorphous silicon or polysilicon, and includes a source region, a drain region, and a channel region.

A gate insulating layer 211 is formed on the active layer 210, and the gate electrode 212 is formed on a predetermined region of the gate insulating layer 211. The forming of the gate insulating layer 211 and the gate electrode 212 is the same as that of the gate insulating layer 111 and the gate electrode 112 of FIG. 1 and thus, a detailed explanation thereof has been omitted for the sake of brevity.

An interlayer insulating layer 214 having contact holes formed therein is formed on the gate electrode 212. The source electrode 215 and the drain electrode 216 respectively contact the source and drain regions of the active layer 210 through the contact holes.

Each source electrode 215 and drain electrode 216 may be formed of an aluminum alloy containing nickel and silicon. The source electrode 215 and the drain electrode 216 may include other elements. In this regard, each source electrode 215 and drain electrode 216 may include a material selected from the group consisting of boron (B), carbon (C), and lanthanide.

Spiking caused by diffusion of aluminum, used to form each source electrode 215 and drain electrode 216, to the active layer 210 can be prevented, and galvanic corrosion can be prevented as described above.

A passivation layer 217 covers and protects the TFT formed as described above. The first electrode 230, which is an anode of the organic light emitting device 270, is formed on the passivation layer 217. The first electrode 230 is electrically connected to the drain electrode 216 of the TFT through a via hole formed in the passivation layer 217.

A pixel defining layer 218 formed of an insulating material covers the first electrode 230 and the passivation layer 217. After a predetermined opening is formed in the pixel defining layer 218, the organic light emitting layer 240 of the organic light emitting device 270 is formed in an area defined by the opening. The second electrode 250, which is a cathode of the organic light emitting device 270, is formed to cover all pixels.

Although the first electrode 230 serves as an anode and the second electrode 250 serves as a cathode in the present embodiment, the polarities of the first and second electrodes 230 and 250 may be opposite to this. When the organic light emitting display 200 is a bottom emission type display that forms images at the side thereof at which the substrate 201 is disposed, as shown in FIG. 3, the first electrode 230 is a transparent electrode and the second electrode 250 is a reflective electrode.

Referring to FIG. 4, the first electrode 230 may have a single layer structure different from the first electrode 130 of FIG. 1. The first electrode 230 may include ITO. Since the organic light emitting display 200 of FIG. 3 is a bottom emission type display, an additional reflective layer is not necessary, and thus the first electrode 230 can be formed as a single layer structure including ITO.

Since an aluminum oxide is not formed on a surface of each source electrode 215 and drain electrode 216 similar to that described with reference to FIG. 1, contact characteristics between the source and drain electrodes 215 and 216 and the first electrode 230 can be improved. That is, contact resistance between the drain electrode 216 and the first electrode 230 can be reduced.

Also, since each source electrode 215 and drain electrode 216 includes boron (B), carbon (C), and lanthanide, galvanic corrosion can be prevented.

Nickel and silicon concentrations of the source electrode 215 and the drain electrode 216 are the same as those described with reference to of FIG. 1. Boron (B), carbon (C), and lanthanide concentrations are also the same as those described with reference to FIG. 1.

The second electrode 250 may be a reflective electrode formed of a metal with a low work function, such as Ag, Mg, Al, Pt, Pd, Au, Ni, Nd, Ir, Cr, Li, or Ca.

The organic light emitting layer 240 disposed between the first electrode 230 and the second electrode 250 emits light when voltages are supplied to the first electrode 230 and the second electrode 250. The organic light emitting layer 240 may be formed of a low molecular organic material or a high molecular organic material, similar to the organic light emitting layer 140 of FIG. 1, and thus a detailed explanation thereof has been omitted.

A sealing member (not shown) may be disposed to face a surface of the second electrode 250 in order to protect the organic light emitting device 270 from external moisture or oxygen. The sealing member may be formed of a transparent material. To this end, the sealing member may be formed of glass, plastic, or a multi-layer structure of a plurality of organic materials and inorganic materials.

Figure 5:
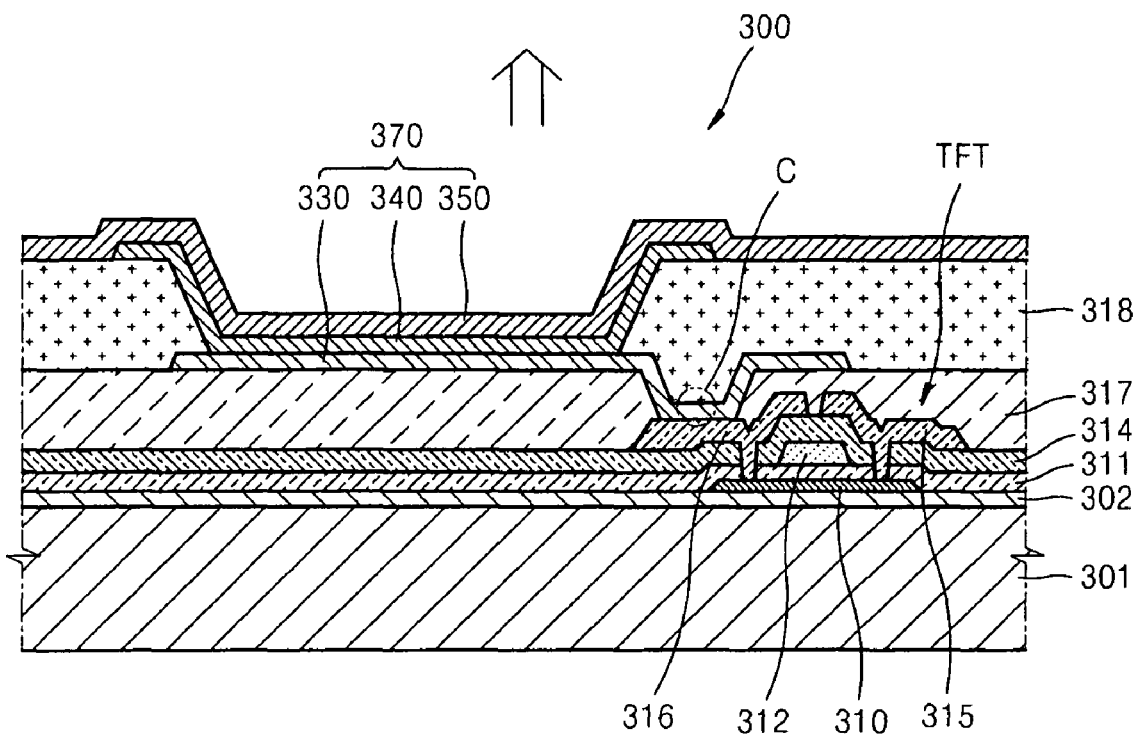
FIG. 5 is a cross-sectional view of an organic light emitting display according to another embodiment of the present invention.
Figure 6:
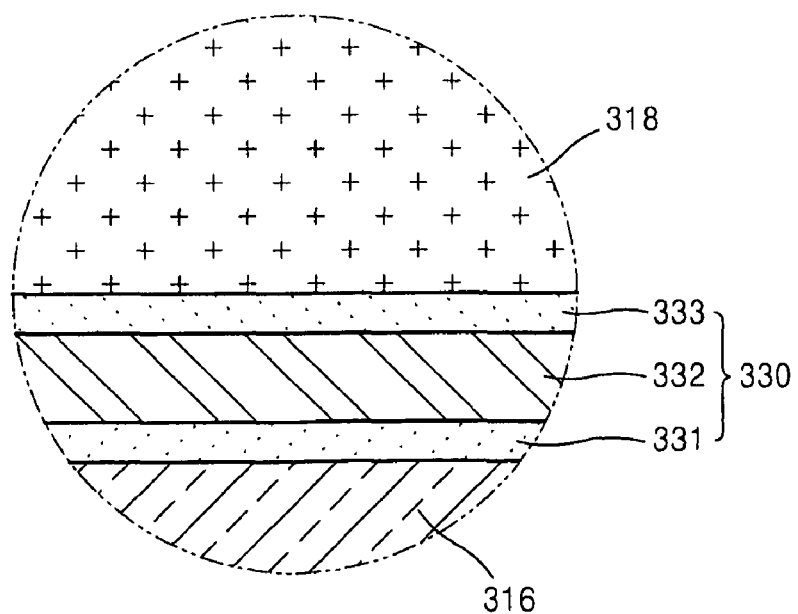
FIG. 6 is an enlarged cross-sectional view of portion C of FIG. 5.

FIG. 5 is a cross-sectional view of an organic light emitting display 300 according to another embodiment of the present invention. FIG. 6 is an enlarged cross-sectional view of portion C of FIG. 5. In FIG. 5, the organic light emitting display 300 is a top emission type display that forms images at a side thereof opposite to that at which a substrate 301 of the organic light emitting display 300 is disposed. Since the organic light emitting display 300 of FIG. 5 is similar to the organic light emitting display 100 of FIG. 1, only differences therebetween are described below.

Referring to FIG. 5, the organic light emitting display 300 according to the current embodiment of the present invention includes the substrate 301, a TFT, and an organic light emitting device 370. The TFT includes an active layer 310, a gate electrode 312, a source electrode 315, and a drain electrode 316.

Each source electrode 315 and drain electrode 316 may be formed as a single layer structure including an aluminum alloy containing germanium (Ge) and gadolinium (Gd). The organic light emitting device 370 includes a first electrode 330, a second electrode 350, and an organic light emitting layer 340.

Each constituent element is explained as follows. The substrate 301 may be formed of a transparent glass material having $SiO_2$ as a main component. However, the substrate 301 is not limited thereto, and may be formed of a transparent plastic material or a non-transparent material. Detailed materials of the substrate 301 are the same as those described with reference to the substrate 101 of FIG. 1, and thus a detailed explanation thereof has been omitted.

A buffer layer 302 is formed on a top surface of the substrate 301. The TFT is formed on a top surface of the buffer layer 302. At least one TFT is formed at each pixel, and the TFT is electrically connected to the organic light emitting device 370.

The active layer 310 having a predetermined pattern is formed on the buffer layer 302. The active layer 310 may be formed of an organic semiconductor or an inorganic semiconductor, such as amorphous silicon or polysilicon, and includes a source region, a drain region, and a channel region.

A gate insulating layer 311 is formed on the active layer 310, and the gate electrode 312 is formed on a predetermined region of the gate insulating layer 311. An interlayer insulating layer 314 having contact holes formed therein is formed on the gate electrode 312.

The source electrode 315 and the drain electrode 316 respectively contact the source and drain regions of the active layer 310 through the contact holes.

Each source electrode 315 and drain electrode 316 may be formed of an aluminum alloy containing germanium (Ge) and gadolinium (Gd).

In a conventional organic light emitting display, a barrier layer is necessary to prevent aluminum used to form a source electrode and a drain electrode from being diffused to an active layer. Accordingly, each source electrode and drain electrode must be formed as a double-layer structure including a barrier layer.

However, according to the present embodiment, each source electrode 315 and drain electrode 316 is formed of an aluminum alloy containing germanium (Ge). In general, if each source electrode 315 and drain electrode 316 is formed of pure aluminum, the silicon of the active layer 310 is dissolved into the source electrode 315 and the drain electrode 316 such that each source electrode 315 and drain electrode 316 has a silicon concentration of 1 wt % or less. As a result, aluminum of each source electrode 315 and drain electrode 316 is diffused into the active layer 310, thereby causing spiking.

However, according to the present embodiment, since each source electrode 315 and drain electrode 316 contains germanium (Ge) at a concentration of more than 1 wt %, which is greater than the concentration obtained when the silicon of the active layer 310 is dissolved into the source electrode 315 and the drain electrode 316, the silicon of the active layer 310 can be prevented from being dissolved into the source electrode 315 and the drain electrode 316. As a result, the aluminum of the source electrode 315 and the drain electrode 316 can be prevented from being diffused to the active layer 310.

When each source electrode 315 and drain electrode 316 contain too much germanium (Ge), the resistance is increased and the electrical characteristics are deteriorated. Accordingly, each source electrode 315 and drain electrode 316 should include germanium (Ge) at a concentration of less than 3 wt %.

Each source electrode 315 and drain electrode 316 are formed of an aluminum alloy containing gadolinium (Gd) to improve contact characteristics with the first electrode 330 and prevent galvanic corrosion, explained later in more detail.

A passivation layer 317 covers and protects the TFT formed as described above. A via hole is formed in the passivation layer 317. The drain electrode 316 formed under the passivation layer 317 is exposed through the via hole.

The first electrode 330, which is an anode of the organic light emitting device 370, is formed on the passivation layer 317.

The first electrode 330 may be formed in a predetermined pattern by photolithography. The first electrode 330 is electrically connected to the drain electrode 316 of the TFT through the via hole.

A pixel defining layer 318 formed of an insulating layer covers the first electrode 330 and the passivation layer 317 After a predetermined opening is formed in the pixel defining layer 318, the organic light emitting layer 340 of the organic light emitting device 370 is formed in an area defined by the opening. The second electrode 350, which is a cathode of the organic light emitting device 370, is formed to cover all pixels.

Although the first electrode 330 serves as an anode and the second electrode 350 serves as a cathode in the present embodiment, the polarities of the first and second electrodes 330 and 350 may be opposite to this.

Referring to FIG. 6, the first electrode 330 includes a first layer 331, a second layer 332, and a third layer 333. The first layer 331, which is the lowermost layer of the first electrode 330, contacts the drain electrode 316 and the passivation layer 317. The first layer 331 may include ITO. The second layer 332 is formed on the first layer 331. The second layer 332 may be formed of a material selected from the group consisting of Ag, Mg, Al, Pt, Pd, Au, Ni, Nd, Ir, Cr, Li, Ca, and a compound thereof, and may act as a reflective layer. The third layer 333 is formed on the second layer 332, and may be formed of ITO, IZO, ZnO, or $In_2O_3$ with a high work function.

When aluminum, used to form the source electrode 315 and the drain electrode 316, is exposed to air, an oxide is naturally formed. Once an oxide layer is formed, contact characteristics between the source and drain electrodes 315 and 316 and the first electrode 330 are deteriorated.

A metal, such as aluminum, used to form the source electrode 315 and the drain electrode 316, has poor electrical contact characteristics with ITO used to form the first layer 331. Hence, due to an aluminum oxide layer formed on each of the source electrode 315 and the drain electrode 316, contact characteristics between the source and drain electrodes 315 and 316 and the first layer 331 are further deteriorated.

To solve the problem, in a conventional organic light emitting display, a protective layer is formed on a contact portion between source and drain electrodes and a first electrode in order to prevent an oxide layer from being formed.

However, according to the present embodiment, each source electrode 315 and drain electrode 316 includes an aluminum alloy containing gadolinium (Gd). The aluminum alloy containing the gadolinium (Gd) can prevent an aluminum oxide ($Al_2O_3$) from being formed.

Since the aluminum oxide can be prevented from being formed on surfaces of the source electrode 315 and the drain electrode 316, the electrical contact characteristics between the source and drain electrodes 315 and 316 and the first electrode 330 can be improved. That is, the contact resistance between the drain electrode 316 and the first electrode 330 can be reduced.

Each source electrode 315 and drain electrode 316 has a gadolinium concentration of 0.01 to 2 wt %. If each source electrode 315 and drain electrode 316 includes less than 0.01 wt % of gadolinium, the desired effect of preventing the aluminum oxide from being formed on the surfaces of the source electrode 315 and the drain electrode 316 cannot be expected. Accordingly, each source electrode 315 and drain electrode 316 should have a gadolinium concentration of more than 0.01 wt %.

If each source electrode 315 and drain electrode 316 includes greater than 2 wt % of gadolinium, the resistance of the source electrode 315 and the drain electrode 316 tends to be increased. Accordingly, each source electrode 315 and drain electrode 316 should have a gadolinium concentration of less than 2 wt %.

Also, when gadolinium (Gd), which is lanthanide, is added, the standard reduction potential of each of the source electrode 315 and the drain electrode 316 is reduced. Accordingly, a standard reduction potential difference between the source and drain electrodes 315 and 316 and the first electrode 330 is reduced, thereby preventing galvanic corrosion.

When the second electrode 350 is a transparent electrode, the second electrode 350 may be formed by depositing a metal with a low work function, such as Ag, Mg, Al, Pt, Pd, Au, Ni, Nd, Ir, Cr, Li, Ca, or a compound thereof, and forming an auxiliary electrode layer or a bus electrode line including a transparent material, such as ITO, IZO, ZnO, or $In_2O_3$, on the deposited metal with the low work function.

The organic light emitting layer 340, disposed between the first electrode 330 and the second electrode 350, emits light when voltages are supplied to the first electrode 330 and the second electrode 350. The organic light emitting layer 340 may be formed of a low molecular organic material or a high molecular organic material. If the organic light emitting layer 340 is formed of a low molecular organic material, an HTL and an HIL may be stacked on the organic light emitting layer 340 in the direction of the first electrode 330, and an electron transport layer and an electron injection layer may be stacked on the organic light emitting layer 340 in the direction of the second electrode 350. If necessary, various other layers may be stacked. The organic materials may be CuPc, NPB, or Alq3.

However, if the organic light emitting layer 340 is formed of a high molecular organic material, only an HTL may be formed under the organic light emitting layer 340 in the direction of the first electrode 330. The HTL is formed on the first electrode 330 by inkjet printing or spin coating by using PEDOT or PANI. The organic light emitting layer 340 may be formed of PPV, soluble PPVs, cyano-PPV, polyfluorene, or the like. A color pattern may be formed by inkjet printing, spin coating, or thermal transfer using laser.

A sealing member (not shown) may be disposed to face a surface of the second electrode 350 in order to protect the organic light emitting device 370 from external moisture or oxygen. The sealing member may be formed of a transparent material. To this end, the sealing member may be formed of glass, plastic, or a multi-layer structure of a plurality of organic materials and inorganic materials.

Figure 7:
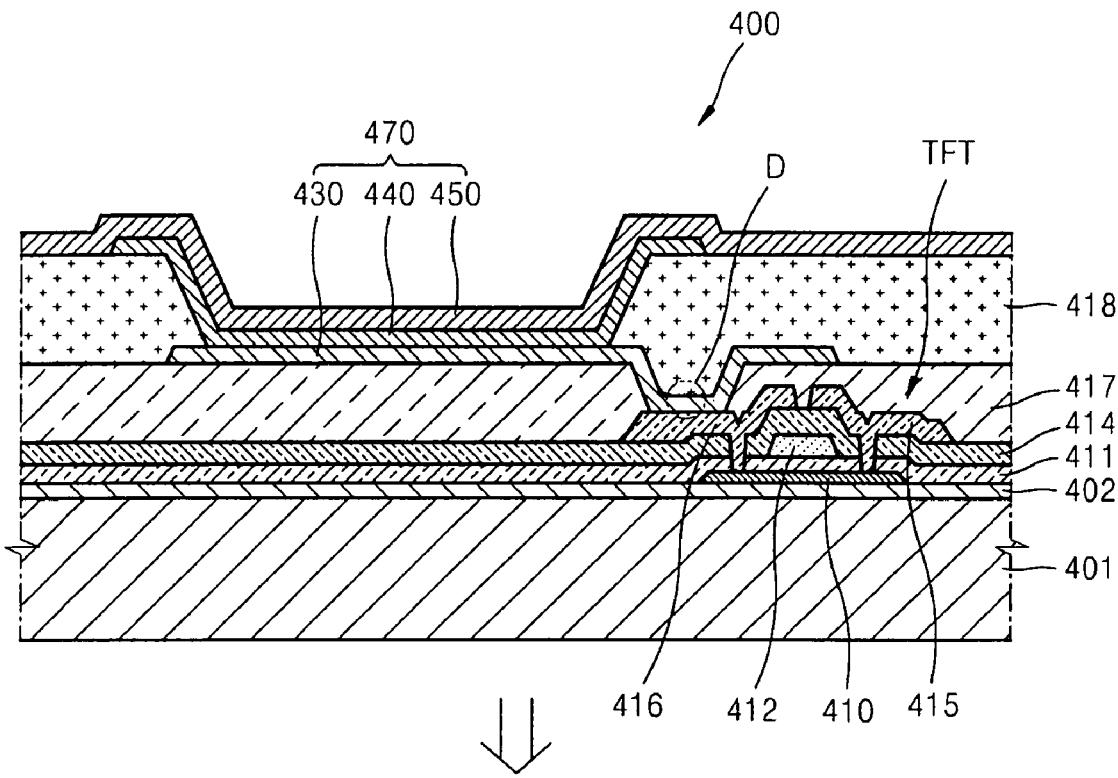
FIG. 7 is a cross-sectional view of an organic light emitting display according to another embodiment of the present invention.
Figure 8:
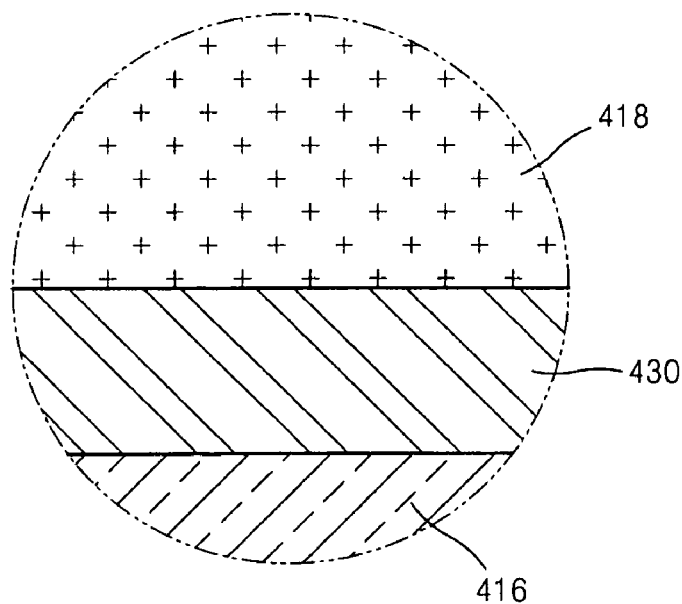
FIG. 8 is an enlarged cross-sectional view of portion D of FIG. 7.

FIG. 7 is a cross-sectional view of an organic light emitting display 400 according to another embodiment of the present invention. FIG. 8 is an enlarged cross-sectional view of portion D of FIG. 7. For convenience, only differences from the previous embodiments are described below. The organic light emitting display 400 of FIG. 7 is a bottom emission type display that forms images at a side thereof at which a substrate 401 of the organic light emitting display 400 is disposed.

Referring to FIG. 7, the organic light emitting display 400 according to the current embodiment of the present invention includes the substrate 401, a TFT, and an organic light emitting device 470. The TFT includes an active layer 410, a gate electrode 412, a source electrode 415, and a drain electrode 416. Each source electrode 415 and drain electrode 416 may be formed as a single layer structure including an aluminum alloy containing germanium and gadolinium. The organic light emitting device 470 includes a first electrode 430, a second electrode 450, and an organic light emitting layer 440.

Each source electrode 415 and drain electrode 416 may be formed of an aluminum alloy containing germanium (Ge) and gadolinium (Gd).

Each of the source electrode 415 and the drain electrode 416 of FIG. 7 contains germanium (Ge) at a concentration of more than 1 wt %, which is greater than the concentration obtained when silicon of the active layer 410 is dissolved (i,e,—diffused) into the source electrode 415 and the drain electrode 416. Germanium (Ge), which is in the same periodic group as silicon, can prevent the silicon of the active layer 410 from being dissolved into the source electrode 415 and the drain electrode 416, like silicon. Accordingly, aluminum of the source electrode 415 and the drain electrode 416 can be prevented from being diffused into the active layer 410.

If the source electrode 415 and the drain electrode 416 contain too much germanium, the resistance is increased and the electrical characteristics are deteriorated. Accordingly, the source electrode 415 and the drain electrode 416 should include less than 3 wt % of germanium (Ge).

Referring to FIG. 8, the first electrode 430 may have a single layer structure. The first electrode 430 may include ITO. Since the organic light emitting display 400 of FIG. 7 is a bottom emission type display, an additional reflective layer is not necessary, and thus the first electrode 430 can be formed as a single layer structure including ITO.

Each source electrode 415 and drain electrode 416 includes an aluminum alloy containing gadolinium (Gd). The aluminum alloy containing the gadolinium (Gd) can prevent an aluminum oxide ($Al_2O_3$) from being formed.

Since the aluminum oxide is not formed on a surface of each of the source electrode 415 and the drain electrode 416, the contact characteristics between the source and drain electrodes 415 and 416 and the first electrode 430 can be improved. That is, the contact resistance between the drain electrode 416 and the first electrode 430 can be reduced.

Each source electrode 415 and drain electrode 416 has a gadolinium concentration of 0.01 to 2 wt %. If each source electrode 415 and drain electrode 416 includes less than 0.01 wt % of gadolinium, the desired effect of preventing the aluminum oxide from being formed on the surfaces of the source electrode 415 and the drain electrode 416 cannot be expected. Accordingly, each source electrode 415 and drain electrode 416 should have a gadolinium concentration of more than 0.01 wt %.

If each source electrode 415 and drain electrode 416 includes greater than 2 wt % of gadolinium, the resistance of the source electrode 415 and the drain electrode 416 tends to be increased. Accordingly, each source electrode 415 and drain electrode 416 should have a gadolinium concentration of less than 2 wt %. Also, when gadolinium (Gd) is added, the standard reduction potential of each of the source electrode 415 and the drain electrode 416 is reduced. Accordingly, a standard reduction potential difference between the source and drain electrodes 415 and 416 and the first electrode 430 including ITO is reduced, thereby preventing galvanic corrosion.

If the second electrode 450 is a transparent electrode, the second electrode 450 may be formed by depositing a metal with a low work function, such as Ag, Mg, Al, Pt, Pd, Au, Ni, Nd, Ir, Cr, Li, Ca, or a compound thereof.

The organic light emitting layer 440 disposed between the first electrode 430 and the second electrode 450 emits light when voltages are supplied to the first electrode 430 and the second electrode 450. The organic light emitting layer 440 may be formed of a low molecular organic material or a high molecular organic material, similar to the organic light emitting layer 440 of FIG. 1, and thus a detailed explanation thereof has been omitted.

A sealing member (not shown) may be disposed to face a surface of the second electrode 450 in order to protect the organic light emitting device 470 from external moisture or oxygen. The sealing member may be formed of a transparent material. To this end, the sealing member may be formed of glass, plastic, or a multi-layer structure of a plurality of organic materials and inorganic materials.

As described above, the organic light emitting display according to the present invention can easily prevent a material used to form the source electrode and the drain electrode from being diffused into the active layer and can reduce the contact resistance between the source and drain electrodes and the first electrode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
a substrate;
an active layer arranged on the substrate, the active layer including silicon;
a gate electrode arranged on the substrate and insulated from the active layer;
a source electrode and a drain electrode each of a single layer structure, insulated from the gate electrode, and electrically connected to the active layer;
a first electrode electrically connected to either the source electrode or the drain electrode;
an organic light emitting layer arranged on the first electrode; and
a second electrode arranged on the organic light emitting layer;
each source electrode and drain electrode being deposited from an aluminum composition comprised of nickel, silicon, and boron (B).

2. The organic light emitting display device of claim 1, wherein each source electrode and drain electrode comprises nickel and silicon, each at a concentration in a range of 1 to 3 wt %.

3. The organic light emitting display device of claim 1, wherein each source electrode and drain electrode comprises a material selected from the group consisting of boron (B), carbon (C), and lanthanide at a concentration in a range of 0.01 to 2 wt %.

4. The organic light emitting display device of claim 1, wherein the first electrode comprises Indium Tin Oxide (ITO).

5. The organic light emitting display device of claim 1, wherein the first electrode comprises:
a first layer contacting either the source electrode or the drain electrode, the first layer including Indium Tin Oxide (ITO);
a second layer arranged on the first layer to reflect light to the organic light emitting layer; and a third layer arranged on the second layer to supply charges to the organic light emitting layer.

6. An organic light emitting display device, comprising:
a substrate;
a thin film transistor comprising a source electrode and a drain electrode each being deposited from an aluminum composition comprised of nickel, silicon, and boron, the thin film transistor being formed on the substrate; and
an organic light emitting device comprising an organic light emitting layer and a first electrode, the first electrode providing direct physical and electrical contact between the organic light emitting layer and one of the source and drain electrodes of the thin film transistor.

7. The organic light emitting display device of claim 6, each one of source and drain electrodes comprises nickel and silicon each at a concentration in a range of 1 to 3 wt %.

8. The organic light emitting display device of claim 6, wherein each one of source and drain electrodes comprises boron at a concentration in a range of 0.01 to 2 wt %.

9. The organic light emitting display device of claim 6, wherein the first electrode comprises Indium Tin Oxide (ITO).

10. The organic light emitting display device of claim 6, wherein the first electrode comprises:
a first layer contacting either the source electrode or the drain electrode, the first layer including Indium Tin Oxide (ITO);
a second layer arranged on the first layer to reflect light to the organic light emitting layer; and
a third layer arranged on the second layer to supply electrical charges to the organic light emitting layer.

11. An organic light emitting display device, comprising:
a substrate;
a thin film transistor comprising at least one of a source electrode and a drain electrode being deposited from an aluminum composition comprised of nickel, silicon, and boron, the thin film transistor being formed on the substrate; and
an organic light emitting device comprising an organic light emitting layer and an electrode, the electrode being comprised of:
a first layer contacting either the source electrode or the drain electrode, the first layer including Indium Tin Oxide (ITO);
a second layer arranged on the first layer to reflect light to the organic light emitting layer; and
a third layer arranged on the second layer to supply electrical charges to the organic light emitting layer.

* * * * *